United States Patent
Wang et al.

(10) Patent No.: US 6,812,149 B1
(45) Date of Patent: Nov. 2, 2004

(54) METHOD OF FORMING JUNCTION ISOLATION TO ISOLATE ACTIVE ELEMENTS

(75) Inventors: Chun Chi Wang, Hsinchu (TW); Chun Lien Su, Hsinchu (TW); Wen Pin Lu, Hsinchu (TW)

(73) Assignee: Macronix International Co., Ltd., Hsin-Chu (TW)

(*) Notice: Subject to any disclaimer, the term of this patent is extended or adjusted under 35 U.S.C. 154(b) by 0 days.

(21) Appl. No.: 10/662,381

(22) Filed: Sep. 16, 2003

(51) Int. Cl.⁷ .................. H01L 21/311; H01L 21/44; H01L 21/28
(52) U.S. Cl. ............... 438/694; 438/671; 438/582
(58) Field of Search .................. 438/694, 671, 438/636, 585, 582, 525, 278, 275

(56) References Cited

U.S. PATENT DOCUMENTS

| | | | |
|---|---|---|---|
| 6,023,085 A | * | 2/2000 | Fang .................. 438/266 |
| 6,426,298 B1 | * | 7/2002 | Chen et al. .......... 438/699 |
| 6,541,164 B1 | * | 4/2003 | Kumar et al. ........ 438/582 |
| 6,579,792 B2 | * | 6/2003 | De Laat et al. ..... 438/671 |
| 6,696,350 B2 | * | 2/2004 | Hung et al. .......... 438/433 |
| 6,723,649 B2 | * | 4/2004 | Chang et al. ........ 438/694 |

* cited by examiner

Primary Examiner—John F. Niebling
Assistant Examiner—Walter L. Lindsay, Jr.
(74) Attorney, Agent, or Firm—Birch, Stewart, Kolasch & Birch, LLP

(57) ABSTRACT

A method of forming junction isolation to isolate active elements. A substrate having a plurality of active areas and an isolation area between active areas is provided. A first gate structure is formed on part of the substrate located in the active areas and, simultaneously, a second gate structure serving as a dummy gate structure is formed on the substrate located in the isolation area. A first doped region is formed in the substrate located at two sides of the first and the second gate structures. A bottom anti-reflection layer is formed on the substrate, the first gate structure and the second gate structure. Part of the bottom anti-reflection layer is etched to expose the second gate structure. The second gate structure is removed to expose the substrate. A second doped region serving as a junction isolation region is formed in the substrate located in the isolation area.

18 Claims, 3 Drawing Sheets

METHOD OF FORMING JUNCTION ISOLATION TO ISOLATE ACTIVE ELEMENTS

BACKGROUND OF THE INVENTION

1. Field of the Invention

The present invention relates to the semiconductor manufacturing process, and more particularly, to a method of forming junction isolation to isolate active elements.

2. Description of the Related Art

All non-trivial integrated electronics involve connection of isolated devices through specific electrical connection paths. The device isolation scheme is therefore critical when fabricating integrated circuits.

Shallow and deep trench isolations have been introduced to the fabrication of devices for isolation between device elements. The trenches are formed by removing part of a silicon substrate with dry etching. Then, using deposition, dielectric material is filled in the trenches, and the surface profile of the trenches is planarized by CMP (chemical mechanical polishing).

Depending on the etching process, refilling process and CMP steps, the fabrication has some drawbacks. For instance, the manufacturing process is complex and costly. In addition, voids are easily formed in the trench during deposition. Also, crystal defects such as dislocation inevitably occur during the trench process. Such defects seriously affect device reliability and yield.

SUMMARY OF THE INVENTION

The object of the present invention is to provide a method of forming junction isolation in a semiconductor substrate.

Another object of the present invention is to provide a method of forming junction isolation to isolate active elements.

In order to achieve these objects, a method of forming junction isolation to isolate active elements is provided. A semiconductor substrate having a plurality of active areas and an isolation area between active areas is provided. A first gate structure is formed on part of the substrate located in the active areas and, simultaneously, a second gate structure serving as a dummy gate structure is formed on the substrate located in the isolation area. A first doped region is formed in the substrate located at two sides of the first gate structure and two sides of the second gate structure. A bottom anti-reflection layer is formed on the substrate, the first gate structure and the second gate structure. Using anisotropy etching, part of the bottom anti-reflection layer is etched back to expose the second gate structure. The second gate structure is removed to expose the substrate. A second doped region serving a junction isolation region is formed in the substrate located in the isolation area. The bottom anti-reflection layer is removed.

The present invention improves on the prior art in that the present method uses the self-alignment of the gate structures to define the isolation area and the active area. Then, after removing the dummy gate structure, suitable ions are implanted into the substrate located in the isolation area to form a junction isolation region in the substrate. Thus, the invention can avoid voids and defects in the substrate, thereby raising reliability and yield, and ameliorating the disadvantages of the prior art.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

FIGS. 1~6 are sectional views according to an embodiment of the present invention.

Figure 1:
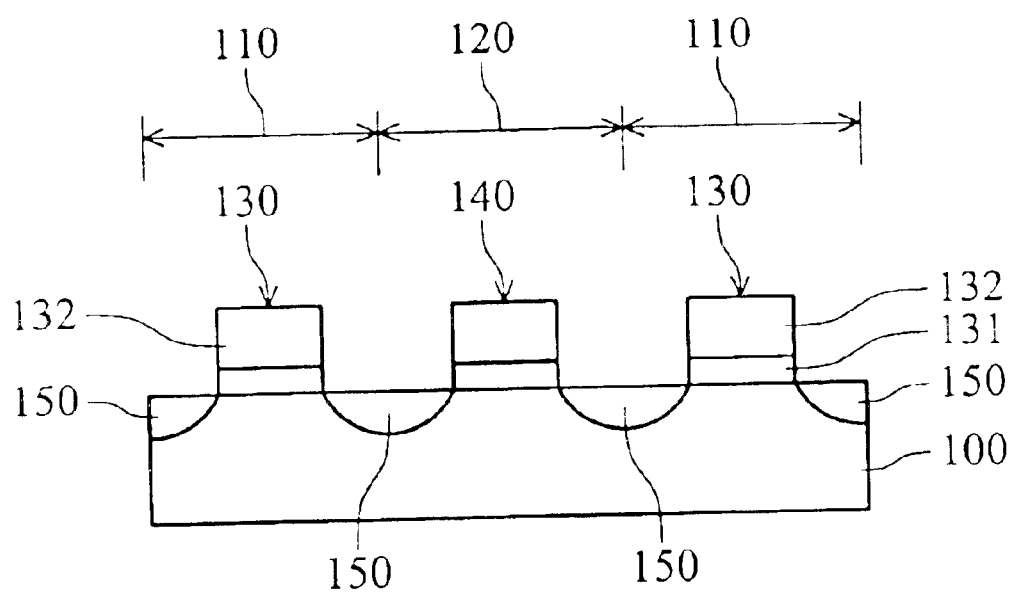
FIGS. 1~6 are sectional views according to an embodiment of the present invention.

In FIG. 1, a semiconductor substrate 100 having a plurality of predetermined active areas 110 and at least one predetermined isolation area 120 between any two active areas 110 is provided. In principle, any semiconductor substrate can be processed using the isolation technique of the invention. In the most likely commercial embodiment, the substrate 100 will be silicon.

In FIG. 1, a first gate structure 130 is formed on part of the substrate 100 located in each of the active areas 110, and a second gate structure 140 is formed on the substrate 100 located in the isolation area 120. As a demonstrative method of forming the first gate structure 130 and the second gate structure 140, referring to FIG. 1, an insulation layer (not shown), such as a $SiO_2$ layer, is formed on the substrate 100 by deposition or thermal oxidation. A conductive layer (not shown), such as a polysilicon layer, is formed on the insulation layer by deposition. Using anisotropy etching, part of the conductive layer and the insulation layer are etched back to form a gate layer 132 and a gate insulation layer 131 on the substrate 100 in each active areas 110 and isolation area 120. That is, the first gate structure 130 and the second gate structure 140 can be simultaneously (in situ) formed on the substrate 100. In addition, the second gate structure 140 serves as a dummy gate structure and will be removed in subsequent process.

In FIG. 1, using implantation of first type ions, a first doped region 150 is formed in the substrate 100 located at two sides of the first gate structure 130 and two sides of the second gate structure 140. The first doped region 150 serves as a source or drain region. Thus, an active element having the first gate structure 130 and the first doped region 150 is obtained.

Figure 2:
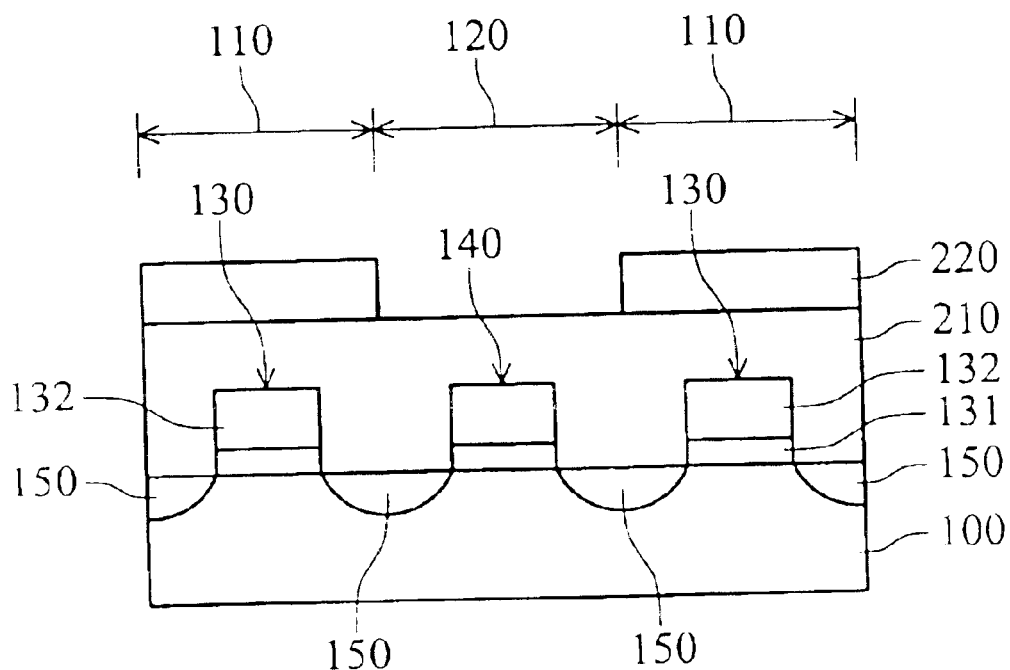

In FIG. 2, a bottom anti-reflection layer 210 is formed on the substrate 100, the first gate structure 130 and the second gate structure 140 by, for example, coating. The bottom anti-reflection layer 210 can be an organic layer, for example, model: AR2 produced by Shipley company.

In FIG. 2, using photolithography, a patterned photoresist layer 220 is formed on the bottom anti-reflection layer 210 located in the active areas 110.

Figure 3:
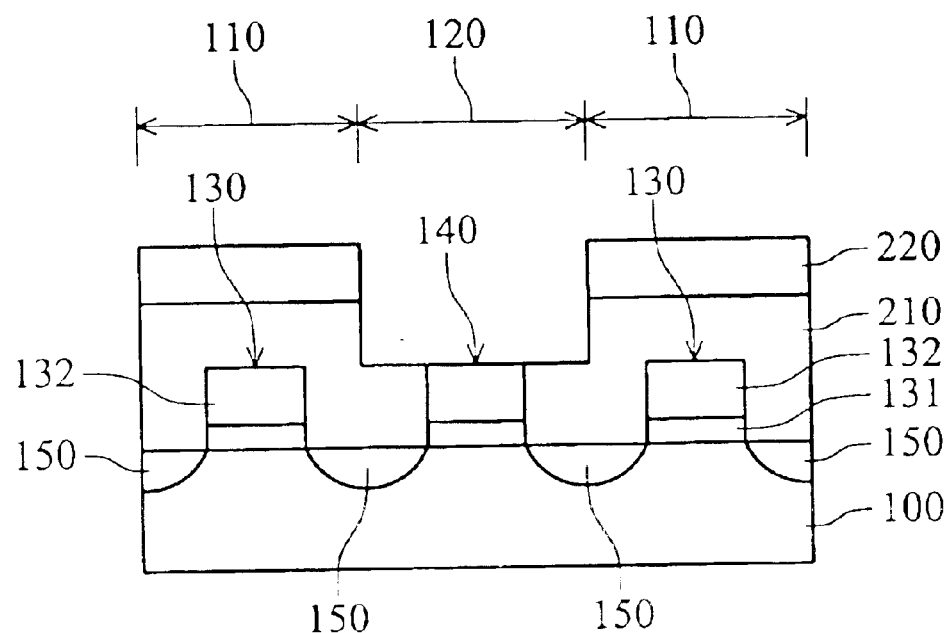

In FIG. 3, using the patterned photoresist layer 220 as a mask, part of the bottom anti-reflection layer 210 is removed by anisotropy etching to expose the top surface of the second gate structure 140. The isotropic etching gas may be $HBr+O_2$.

Figure 4:
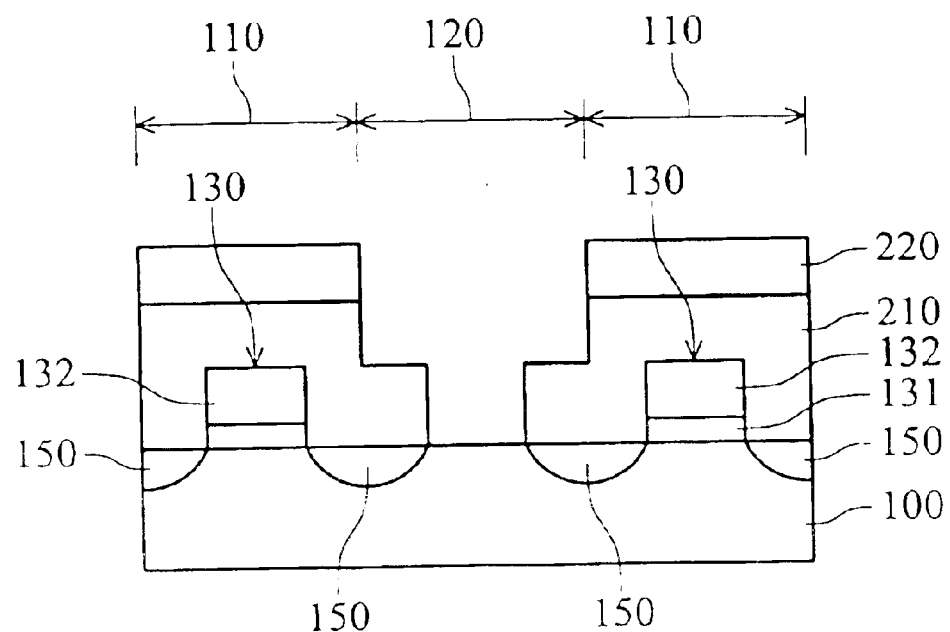

In FIG. 4, the second gate structure 140 is removed by anisotropy etching to expose the surface of the substrate 100. The isotropic etching gas may be $CCl_4+HBr+O_2$.

Figure 5:
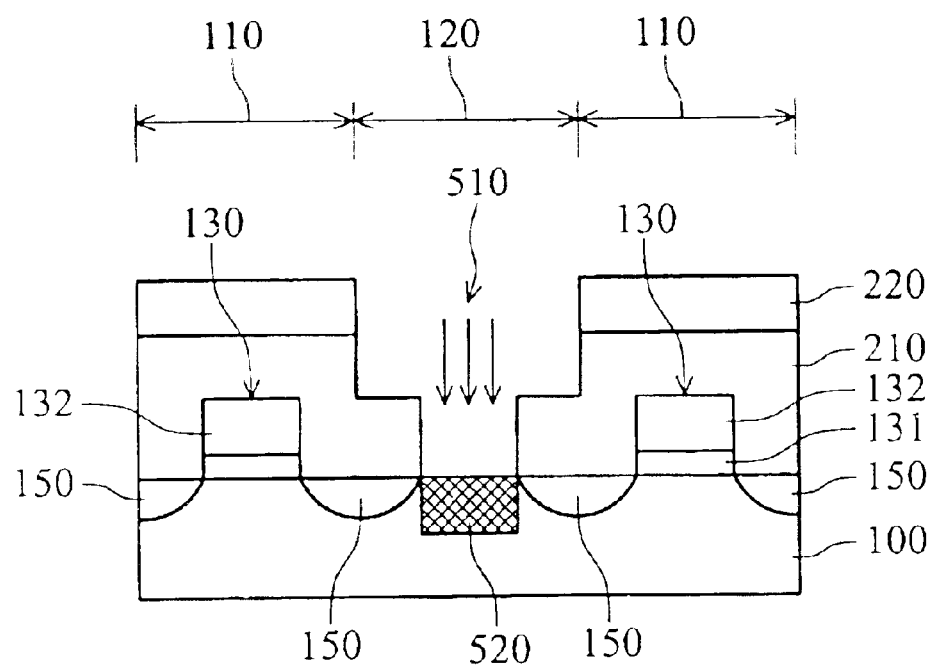

In FIG. 5, using the patterned photoresist layer 220 and the remaining bottom anti-reflection layer 210 as a mask, a second doped region 520 is formed in the substrate 100 located in the isolation area 120 by, for example, implantation 510 of second type ions. The conditions of the implantation 510 can be 40~80 KeV for power and 1E18~1E19 $cm^{-3}$ for dosage.

It should be noted that the first type ions and the second type ions are different. When the first type ions are N-type ions, the second type ions are P-type ions. Contrarily, when the first type ions are P-type ions, the second type ions are N-type ions. The N-type ions are, for example, phosphorous ions or arsenic ions. The P-type ions are, for example, boron ions. Thus, according to the above steps, the second doping region 520 serving as a P-N junction isolation region to isolate active elements is obtained.

Figure 6:
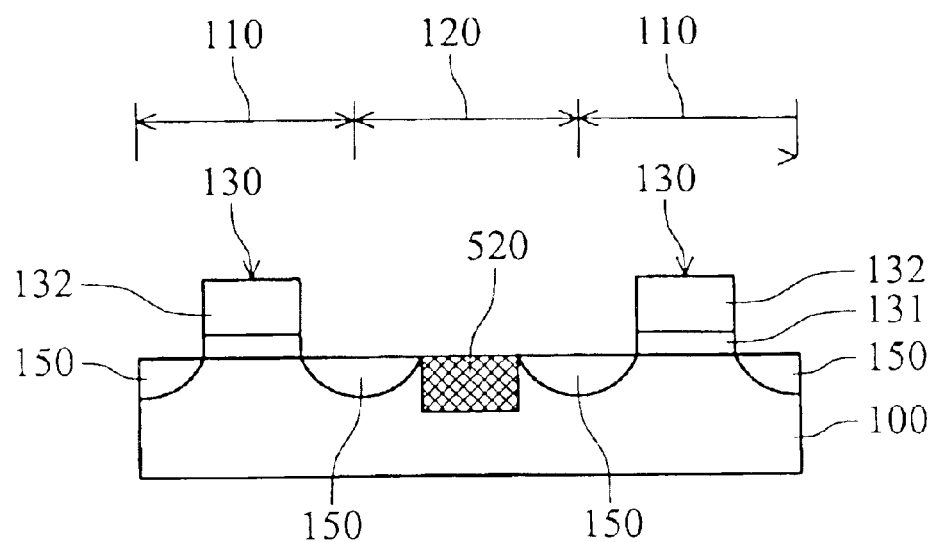

In FIG. 6, the patterned photoresist layer 220 is removed by wet or dry etching.

In FIG. 6, the bottom anti-reflection layer 210 is removed by wet or dry etching.

Thus, the present invention uses the self-alignment of the gate structures to define the isolation area and the active area, then removes the dummy gate structure, and then implants suitable ions into the substrate located in the isolation area to form junction isolation. Thus, the invention avoids voids and defects existing in the substrate, thereby raising reliability and yield, and ameliorating the disadvantages of the prior art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method forming junction isolation to isolate active elements, comprising the steps of:
   providing a semiconductor substrate having a plurality of active areas and at least one isolation area between any two active areas;
   forming a first gate structure on part of the substrate located in the active areas and a second gate structure on the substrate located in the isolation area;
   forming a first doped region in the substrate located at two sides of the first gate structure and two sides of the second gate structure;
   forming a bottom anti-reflection layer on the substrate, the first gate structure and the second gate structure;
   anisotropic etching back part of the bottom anti-reflection layer to expose the second gate structure;
   removing the second gate structure to expose the surface of the substrate;
   forming a second doped region in the substrate located in the isolation area, wherein a type of dopant in the first doped region is opposite to that in the second doped region; and
   removing the bottom anti-reflection layer.

2. The method according to claim 1, wherein the first gate structure and the second gate structure are simultaneously formed on the substrate.

3. The method according to claim 1, wherein the second gate structure serves as a dummy gate structure.

4. The method according to claim 2, wherein the method of forming the first gate structure and the second gate structure comprises the steps of:
   forming an insulation layer on the substrate;
   forming a conductive layer on the insulation layer; and
   anisotropic etching back part of the conductive layer and the insulation layer to form a gate layer and a gate insulation layer on the substrate.

5. The method according to claim 1, wherein the first doped region is implanted with N-type ions and the second doped region is implanted with P-type ions.

6. The method according to claim 1, wherein the first doped region is implanted with P-type ions and the second doped region is implanted with N-type ions.

7. The method according to claim 1, wherein the anti-reflection layer is an organic layer.

8. The method according to claim 4, wherein the insulation layer is a $SiO_2$ layer.

9. The method according to claim 4, wherein the conductive layer is a polysilicon layer.

10. A method of forming junction isolation to isolate active elements, comprising the steps of:
    providing a semiconductor substrate having a plurality of active areas and at least one isolation area between any two active areas;
    forming a first gate structure on part of the substrate located in the active areas and a second gate structure on the substrate located in the isolation area;
    forming a first doped region in the substrate located at two sides of the first gate structure and two sides of the second gate structure;
    forming a bottom anti-reflection layer on the substrate, the first gate structure and the second gate structure;
    forming a patterned photoresist layer on the bottom anti-reflection layer located in the active areas;
    using the patterned photoresist layer as a mask, anisotropic etching back part of the bottom anti-reflection layer to expose the second gate structure;
    removing the second gate structure to expose the surface of the substrate;
    forming a second doped region in the substrate located in the isolation area, wherein a type of dopant in the first doped region is opposite to that in the second doped region;
    removing the patterned photoresist layer; and
    removing the bottom anti-reflection layer.

11. The method according to claim 10, wherein the first gate structure and the second gate structure are simultaneously formed on the substrate.

12. The method according to claim 10, wherein the second gate structure serves as a dummy gate structure.

13. The method according to claim 11, wherein the method of forming the first gate structure and the second gate structure comprises the steps of:
    forming an insulation layer on the substrate;
    forming a conductive layer on the insulation layer; and
    anisotropic etching back part of the conductive layer and the insulation layer to form a gate layer and a gate insulation layer on the substrate.

14. The method according to claim 10, wherein the first doped region is implanted with N-type ions and the second doped region is implanted with P-type ions.

15. The method according to claim 10, wherein the first doped region is implanted with P-type ions and the second doped region is implanted with N-type ions.

16. The method according to claim 10, wherein the anti-reflection layer is an organic layer.

17. The method according to claim 13, wherein the insulation layer is a $SiO_2$ layer.

18. The method according to claim 13, wherein the conductive layer is a polysilicon layer.

\* \* \* \* \*